(12) United States Patent
Kolev et al.

(10) Patent No.: US 10,326,028 B1
(45) Date of Patent: Jun. 18, 2019

(54) COMPLEMENTARY METAL-OXIDE-SEMICONDUCTOR (CMOS) VOLTAGE-CONTROLLED RESISTOR

(71) Applicant: QUALCOMM Incorporated, San Diego, CA (US)

(72) Inventors: Plamen Vassilev Kolev, San Diego, CA (US); Sinan Goktepeli, San Diego, CA (US); Peter Graeme Clarke, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/865,117

(22) Filed: Jan. 8, 2018

(51) Int. Cl.
| | |
|---|---|
| *H01L 21/02* | (2006.01) |
| *H01L 23/60* | (2006.01) |
| *H01L 23/64* | (2006.01) |
| *H01L 27/02* | (2006.01) |
| *H01L 29/06* | (2006.01) |
| *H01L 29/66* | (2006.01) |
| *H01L 29/86* | (2006.01) |
| *H01L 23/522* | (2006.01) |
| *H01L 23/528* | (2006.01) |
| *H01L 23/552* | (2006.01) |
| *H01L 29/8605* | (2006.01) |
| *H01L 29/40* | (2006.01) |

(52) U.S. Cl.
CPC ........ *H01L 29/86* (2013.01); *H01L 21/02532* (2013.01); *H01L 23/528* (2013.01); *H01L 23/552* (2013.01); *H01L 29/0649* (2013.01); *H01L 29/0684* (2013.01); *H01L 29/66083* (2013.01); *H01L 23/5225* (2013.01); *H01L 23/60* (2013.01); *H01L 23/647* (2013.01); *H01L 27/0285* (2013.01); *H01L 27/0292* (2013.01); *H01L 27/0296* (2013.01); *H01L 29/405* (2013.01); *H01L 29/8605* (2013.01)

(58) Field of Classification Search
CPC ........ H01L 24/34; H01L 24/38; H01L 24/41; H01L 23/5286; H01L 23/49838; H01L 23/60; H01L 23/5225; H01L 23/522; H01L 23/647; H01L 27/0285; H01L 27/0292; H01L 27/0296; H01L 29/8605; H01L 29/405

See application file for complete search history.

(56) References Cited

U.S. PATENT DOCUMENTS

| | | |
|---|---|---|
| 5,134,088 A | 7/1992 | Zetterlund |
| 6,300,668 B2 | 10/2001 | Miller et al. |
| 6,703,682 B2 | 3/2004 | Aswell |
| 7,169,661 B2 | 1/2007 | Huang et al. |
| 8,106,479 B1 * | 1/2012 | Nathawad ........... H01L 23/5225 257/533 |
| 9,543,374 B2 | 1/2017 | Baldwin et al. |

(Continued)

*Primary Examiner* — David A Zarneke
(74) *Attorney, Agent, or Firm* — Qualcomm Incorporated/Seyfarth Shaw LLP

(57) ABSTRACT

A resistor may include a semiconductor layer having a source region, a drain region, and a channel region. The channel region may be between the source region and the drain region. The channel region may have a same polarity as the source region and the drain region. The resistor may further include a first inter-metal dielectric (IMD) layer on the channel region. The resistor may further include a front-side gate shield on the first IMD layer. The front-side gate shield may overlap the channel region.

20 Claims, 12 Drawing Sheets

(56) References Cited

U.S. PATENT DOCUMENTS

| | | | | |
|---|---|---|---|---|
| 9,640,531 B1* | 5/2017 | Or-Bach | ............. | H01L 27/0688 |
| 9,673,173 B1* | 6/2017 | Li | ....................... | H01L 25/0655 |
| 2004/0017701 A1* | 1/2004 | Asano | ................. | H01L 23/4824 |
| | | | | 365/200 |
| 2006/0255434 A1* | 11/2006 | Degani | ................. | H01L 23/552 |
| | | | | 257/659 |
| 2017/0029536 A1* | 2/2017 | Munshi | ................ | B01J 19/0013 |
| 2017/0213821 A1* | 7/2017 | Or-Bach | ................. | H01L 21/48 |

* cited by examiner

WELL ISOLATION

TRENCH ISOLATION

US 10,326,028 B1

COMPLEMENTARY METAL-OXIDE-SEMICONDUCTOR (CMOS) VOLTAGE-CONTROLLED RESISTOR

BACKGROUND

Field

Aspects of the present disclosure relate to semiconductor devices and, more particularly, to resistors.

Background

Mobile radio frequency (RF) chips (e.g., mobile RF transceivers) have migrated to a deep sub-micron process node due to cost and power consumption considerations. Designing such mobile RF transceivers becomes complex at this deep sub-micron process node. Designing these mobile RF transceivers is further complicated by added circuit functions for supporting communication enhancements, such as carrier aggregation. Further design challenges for mobile RF transceivers include analog/RF performance considerations, including mismatch, noise, and other performance considerations. Designs of these mobile RF transceivers may include additional passive devices, for example, for biasing and suppressing resonance, and/or for performing filtering, bypassing, and coupling.

At the deep sub-micron process node, small-sized resistors having large values are desired. Conventional resistors are prone to severe bias interference from adjacent conductive layers and also exhibit non-negligible voltage dependence from voltages applied across the terminals. Therefore, there is a desire for small-sized, large-valued resistors that overcome these deficiencies.

SUMMARY

A resistor may include a semiconductor layer having a source region, a drain region, and a channel region. The channel region may be between the source region and the drain region. The channel region may have a same polarity as the source region and the drain region. The resistor may further include a first inter-metal dielectric (IMD) layer on the channel region. The resistor may further include a front-side gate shield on the first IMD layer. The front-side gate shield may overlap the channel region.

A method of fabricating a resistor may include fabricating a semiconductor layer having a source region, a drain region, and a channel region between the source region and the drain region. The method may further include doping the channel region to have a same polarity as the source region and the drain region. The method may further include depositing a first inter-metal dielectric (IMD) layer on the channel region. The method may further include fabricating a front-side gate shield on the first IMD layer. The front-side gate shield may overlap the channel region.

A resistor may include a semiconductor layer having a source region, a drain region, and a channel region. The channel region may be between the source region and the drain region. The channel region hay have a same polarity as the source region and the drain region. The resistor may further include a first inter-metal dielectric (IMD) layer on the channel region. The resistor may further include means for shielding on the first IMD layer. The shielding means may overlap the channel region.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
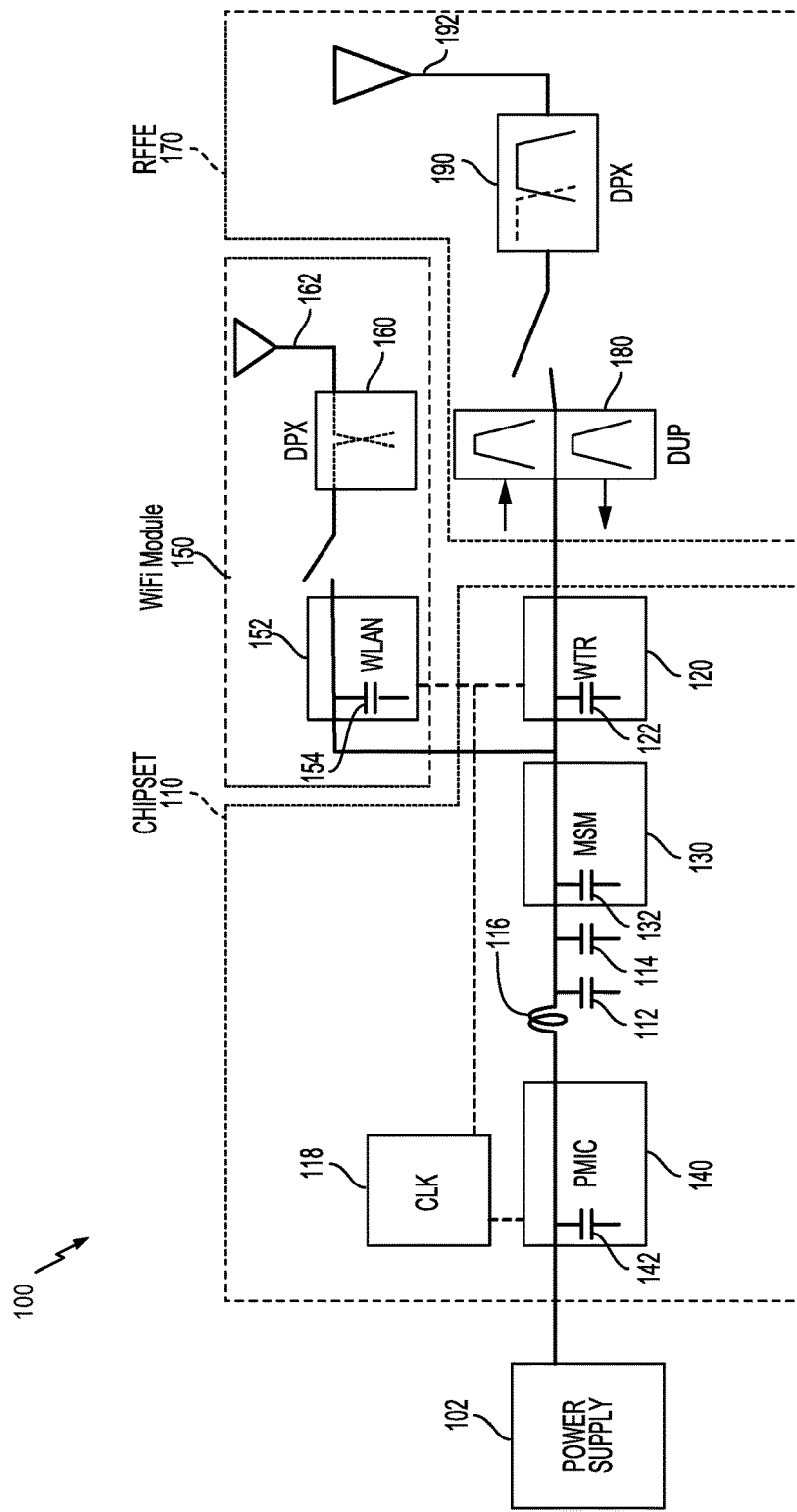
FIG. 1 is a schematic diagram of a radio frequency (RF) front end module.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation.

The design of these mobile RF transceivers may include the use of silicon on insulator technology. Silicon on insulator (SOI) technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer.

Conventional complementary metal-oxide-semiconductor (CMOS) technology begins with a front-end-of-line (FEOL), in which a first set of process steps are performed for fabricating active devices (e.g., negative MOS (NMOS) or positive MOS (PMOS) transistors) on a substrate (e.g., a silicon-on-insulator (SOI) substrate). A middle-of-line (MOL) is performed next, which is a set of process steps that connect the active devices to the back-end-of-line (BEOL) interconnects (e.g., M1, M2, M3, M4, etc.) using middle-of-line contacts. Unfortunately, interference between each layer may result due to a close proximity of adjacent conductive layers.

The front-end-of-line processes may include the set of process steps that form the active devices (e.g., transistors). The front-end-of-line processes include ion implantation, anneals, oxidation, chemical vapor deposition (CVD) or atomic layer deposition (ALD), etching, chemical mechanical polishing (CMP), and epitaxy. The middle-of-line processes may include the set of process steps that enable connection of the transistors to BEOL interconnects. These steps include silicidation and contact formation, as well as stress introduction. The back-end-of-line processes may include the set of process steps that form the interconnects that tie the independent transistors and form circuits. Currently, copper and aluminum are materials to form the interconnects, but with further development of the technology, other conductive materials may be used.

Conventional metal-oxide-semiconductor field-effect-transistors (MOSFETs) with source and drain regions having a same low body doping are implemented as small-area, high-value resistors, such as thick oxide depletion mode N-channel metal-oxide-semiconductor (NMOS) (TDN) transistors. Unfortunately, these devices are prone to large resistance variations due to a variable bias of a handle wafer placed above a polysilicon gate and interconnects. These shortcomings have caused chip designers to abandon using these types of devices. Still, chip designers have a strong interest in a scalable small-size resistor having a small parasitic capacitance and inductance, a large resistance, and a high linearity. Additionally, the scalable resistor should be capable of being implemented with a layer-transfer SOI CMOS process or other CMOS process, including standard SOI and bulk CMOS processes. Furthermore, this device should also be capable of use in RF circuits where its small size is expected to provide very low parasitic capacitance and inductance, particularly in conjunction with a standard SOI CMOS process and a layer-transfer SOI CMOS process.

Aspects of the present disclosure provide a MOSFET device with a high-resistivity body having source and drain regions with a same type doping that may be available for gate control. For example, a first level interconnect metal (e.g., an M1 layer) instead of a typical polysilicon gate may be used in silicon (Si) based CMOS processes. Due to a large distance between the first level interconnect layer and a Si surface, similar devices have very weak gate control and are prone to bias interference due to electricity field sensitivity of a body region with low doping.

Nevertheless, operating near to a threshold voltage increases an impact of the gate voltage on a device conductance. Therefore, the proposed device may be constructed to have a nearly zero threshold voltage with a low conductivity at a zero gate bias, which may facilitate its use as a small-area, large-value resistor. Because of the relatively thick configuration of dielectric interconnects, the threshold voltage may be very high and the device may operate in a linear regime even for a large bias between the source and drain regions.

Because a desired geometry for resistors is generally a long-length and a narrow-width, process variations in fabricating a channel due to a lack of a self-aligned polysilicon gate, which is typical for MOSFETs, are not expected to have significant detrimental effects on the performance of the resistor. A backside gate may be used to further improve resistance and voltage regulation because a threshold voltage of the backside gate channel may be substantially lower than that of a front-side gate, but still much higher compared to a standard device with a polysilicon gate. Therefore, one may trade off linearity for better gate control by adding a backside gate.

A front-side gate may prevent interference from conductive layers above the active portion of the device. In one configuration, both front-side and a backside gates are large enough to completely shield a resistor body from external electric fields, thus significantly reducing interference and cross-talk in complex, mixed-signal, and RF circuits. When only a front-side gate is used, a bias interference from conductive layers above the resistor, including a handle wafer in a layer-transfer SOI CMOS device, may be avoided by a sufficient extension of a gate metal to sufficiently cover an active Si layer.

Aspects of the present disclosure provide for a resistor having a semiconductor layer including a source region, a drain region, and a channel region between the source region and the drain region. The channel region may have a same polarity as the source region and the drain region. The resistor may further include a first inter-metal dielectric (IMD) layer on the channel region, and a front-side gate shield on the first IMD layer. The front-side gate shield may overlap the channel region.

According to aspects of the present disclosure, a thick oxide depletion mode N-channel metal-oxide-semiconductor (NMOS) (TDN) transistor may be configured as a resistor. For example, the TDN transistor may include source and drain regions having a same low body doping. According to aspects of the present disclosure, the TDN transistor may be an N-type MOS resistor.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably.

FIG. 1 is a schematic diagram of a wireless device 100 (e.g., a cellular phone or a smartphone) having an N-type metal-oxide-semiconductor (MOS) resistor, according to aspects of the present disclosure. The wireless device 100 may include a wireless local area network (WLAN) (e.g., WiFi) module 150 and a RF front end module 170 for a chipset 110. The WiFi module 150 includes a first diplexer 160 communicably coupling an antenna 162 to a wireless local area network module (e.g., WLAN module 152). The RF front end module 170 includes a second diplexer 190 communicably coupling an antenna 192 to the wireless transceiver 120 (WTR) through a duplexer 180 (DUP).

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile RF transceiver to transmit and receive data for two-way communication. A mobile RF transceiver may include a transmit section for data transmission and a receive section for data reception. For data transmission, the transmit section may modulate a RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communication signal.

The wireless transceiver 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the wireless transceiver 120.

The wireless transceiver 120 and the RF front end module 170 may be implemented using semiconductor on insulator (SOI) technology for fabricating transistors of the wireless transceiver 120 and the RF front end module 170, which reduces high order harmonics in the RF front end module 170. SOI technology replaces conventional semiconductor substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on an SOI layer and an SOI substrate supporting the BOX layer. A layer transfer process to further separate the active device from an SOI substrate is shown in FIGS. 2A to 2D.

Figure 2A:
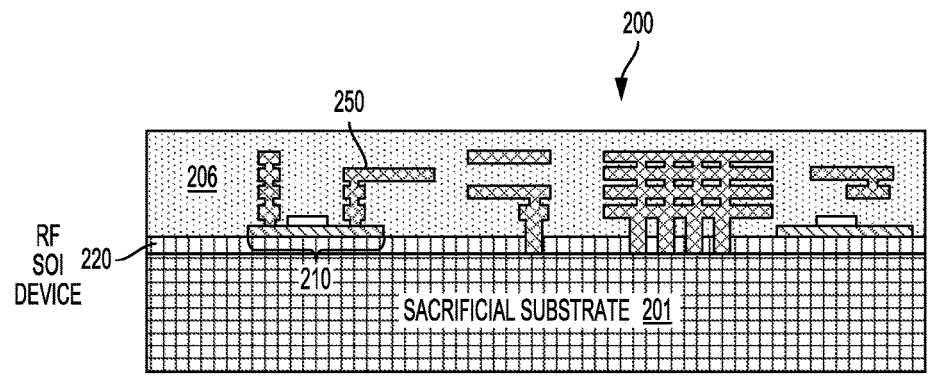
FIGS. 2A to 2D show cross-sectional views of an integrated radio frequency (RF) circuit structure during a layer transfer process.
Figure 2B:
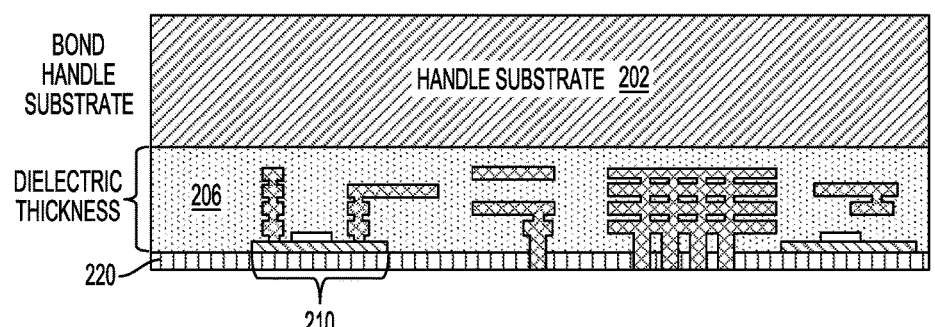

FIGS. 2A to 2D show cross-sectional views of an integrated radio frequency (RF) circuit structure 200 during a layer transfer process according to aspects of the present disclosure. As shown in FIG. 2A, an RF silicon on insulator (SOI) device includes an active device 210 on a buried oxide (BOX) layer 220 supported by a sacrificial substrate 201 (e.g., a bulk wafer). The RF SOI device also includes interconnects 250 coupled to the active device 210 within a front-side dielectric layer 206. As shown in FIG. 2B, a handle substrate 202 is bonded to the front-side dielectric layer 206 of the RF SOI device. In addition, the sacrificial substrate 201 is removed. Removal of the sacrificial substrate 201 using the layer transfer process enables high-performance, low-parasitic RF devices by increasing the dielectric thickness. That is, a parasitic capacitance of the RF SOI device is inversely proportional to the dielectric thickness, which determines the distance between the active device 210 and the handle substrate 202.

Figure 2C:
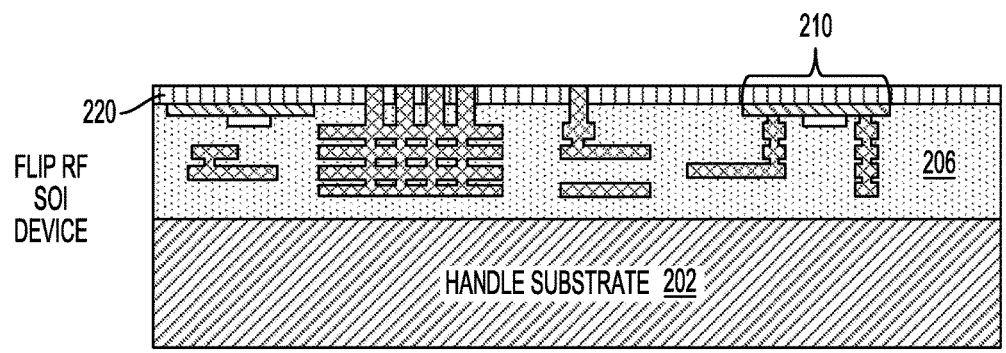
Figure 2D:
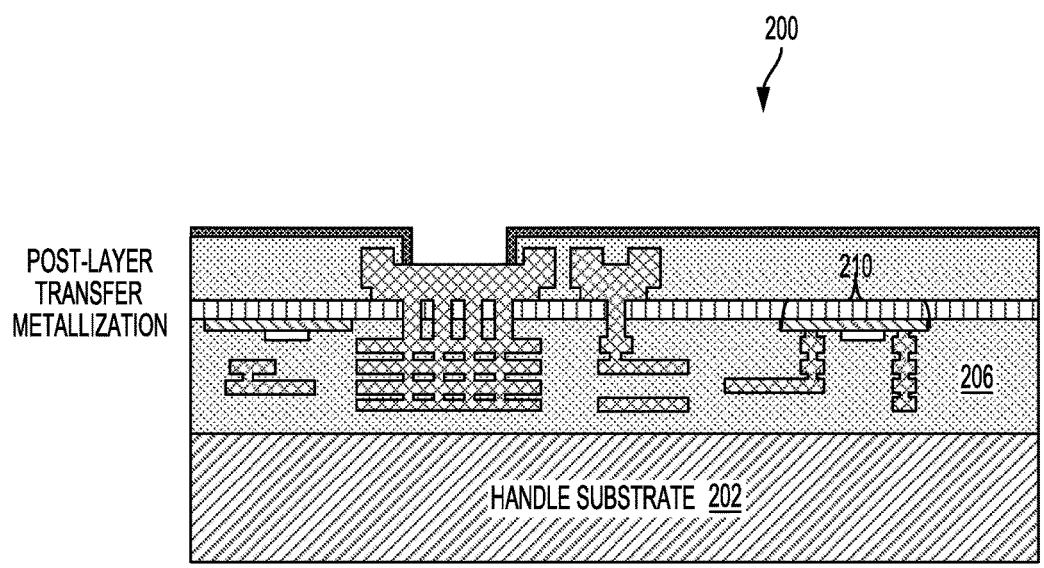

As shown in FIG. 2C, the RF SOI device is flipped once the handle substrate 202 is secured and the sacrificial substrate 201 are removed. As shown in FIG. 2D, a post layer transfer metallization process is performed using, for example, a regular complementary metal-oxide-semiconductor (CMOS) process. The integrated RF circuit structure 200 may be completed by depositing a passivation layer, opening bond pads, depositing a redistribution layer, and forming conductive bumps/pillars to enable bonding of the integrated RF circuit structure 200 to a system board (e.g., a printed circuit board (PCB)).

Referring again to FIG. 2A, the RF SOI device may include a trap rich layer between the sacrificial substrate 201 and the BOX layer 220. In addition, the sacrificial substrate 201 may be replaced with the handle substrate, and a thickness of the BOX layer 220 may be increased to improve harmonics. Although this arrangement of the RF SOI device may provide improved harmonics relative to a pure silicon or SOI implementation, the RF SOI device is limited by the non-linear responses from the handle substrate, especially when a silicon handle substrate is used. That is, in FIG. 2A, the increased thickness of the BOX layer 220 does not provide sufficient distance between the active device 210 and the sacrificial substrate 201 relative to the configurations shown in FIGS. 2B to 2D. Moreover, the RF SOI device is generally limited to CMOS transistor formation on one side of the SOI layer.

Figure 3:
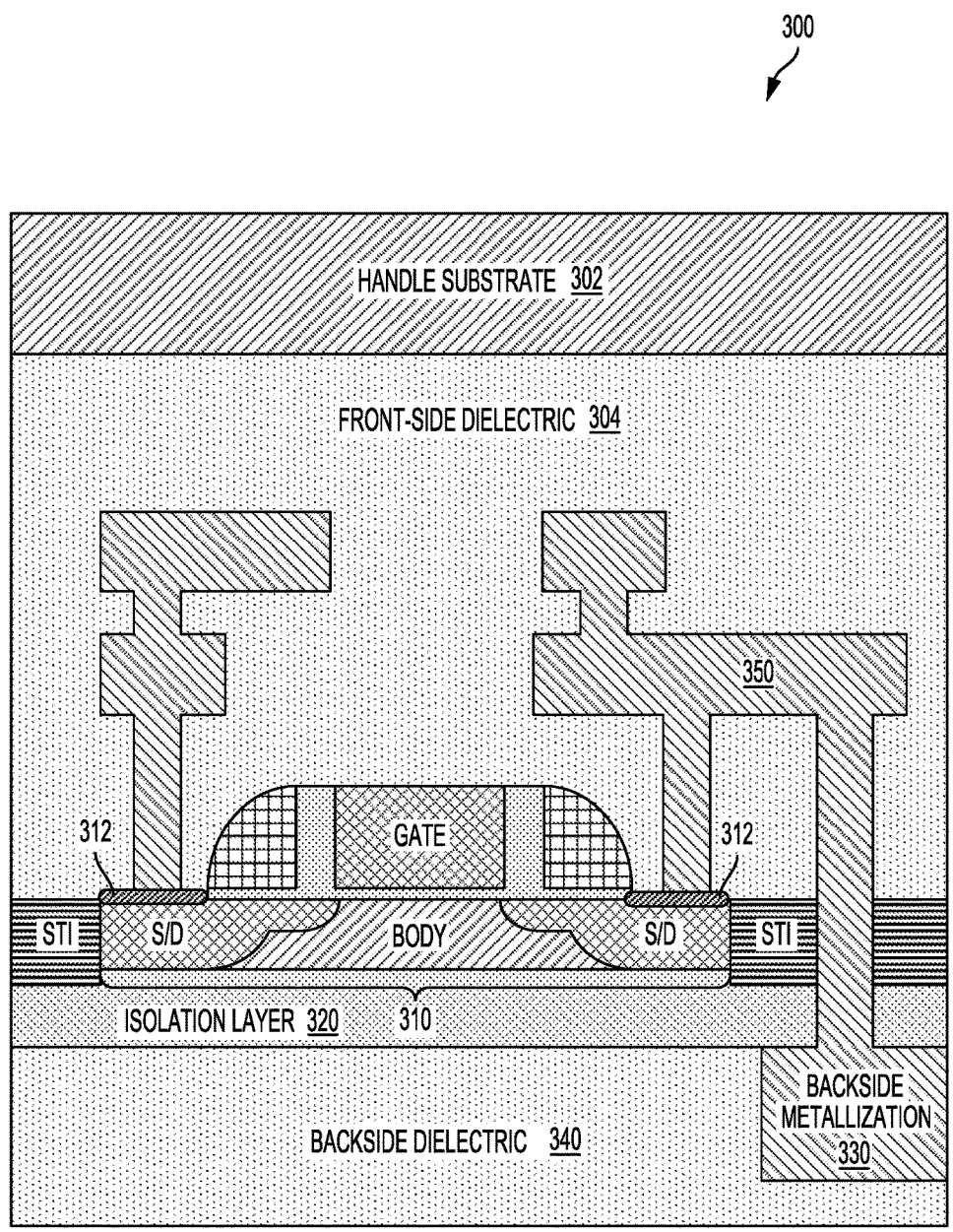
FIG. 3 is a cross-sectional view of an integrated radio frequency (RF) circuit structure fabricated using a layer transfer process.

FIG. 3 is a cross-sectional view of an integrated radio frequency (RF) circuit structure 300 fabricated using a layer transfer process according to aspects of the present disclosure. Representatively, the integrated RF circuit structure 300 includes an active device 310 having a gate, a body, and source/drain regions formed on an isolation layer 320. In silicon on insulator (SOI) implementations, the isolation layer 320 is a buried oxide (BOX) layer, and the body and source/drain regions are formed from an SOI layer including shallow trench isolation (STI) regions supported by the BOX layer.

The integrated RF circuit structure 300 also includes middle-of-line (MOL)/back-end-of-line (BEOL) interconnects coupled to the source/drain regions of the active device 310. As described, the MOL/BEOL layers are referred to as front-side layers. By contrast, the layers supporting the isolation layer 320 may be referred to as backside layers. According to this nomenclature, a front-side interconnect 350 is coupled to the source/drain regions of the active device 310 through front-side contacts 312 in a front-side dielectric layer 304. In addition, a handle substrate 302 is coupled to the front-side dielectric layer 304. In this configuration, a backside dielectric layer 340 is adjacent to and possibly supports the isolation layer 320. In addition, a backside metallization 330 is coupled to the front-side interconnect 350.

As shown in FIG. 3, a layer transfer process increases separation between the active device 310 and the handle substrate 302 to improve the harmonics of the integrated RF circuit structure 300. Various aspects of the disclosure provide techniques for layer transfer and post transfer metallization to provide access to a backside of devices of an integrated radio frequency (RF) integrated structure. By contrast, access to devices, formed during a front-end-of-line (FEOL) process, is conventionally provided during a middle-of-line (MOL) processing that provides contacts between the gates and source/drain regions of the devices and back-end-of-line (BEOL) interconnect layers (e.g., M1, M2, etc.).

Figure 4:
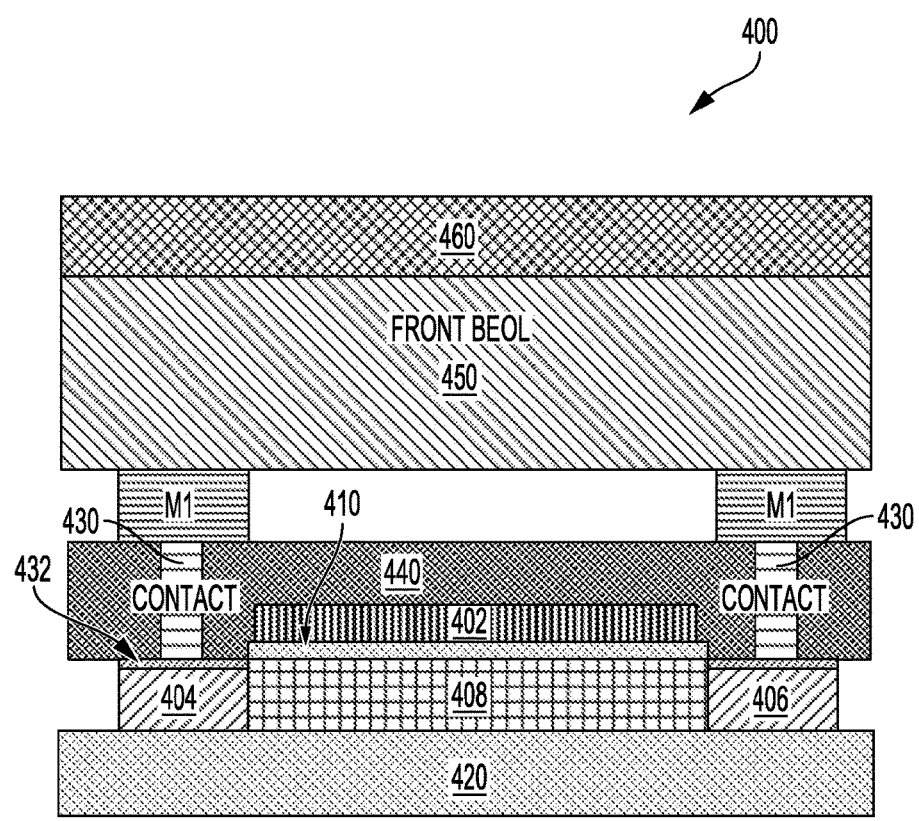
FIG. 4 is a conventional thick oxide depletion mode N-channel metal-oxide-semiconductor (NMOS) (TDN) transistor.

FIG. 4 is a conventional thick oxide depletion mode N-channel metal-oxide-semiconductor (NMOS) (TDN) transistor 400, that may be configured as a resistor. The TDN transistor 400 includes a gate 402, a source 404, a drain 406, and a channel 408. A gate oxide 410 is between the gate 402 and the channel 408. A buried oxide layer 420 supports the TDN transistor 400. Contacts 430 couple the source 404 and the drain 406 to an M1 interconnect layer through an inter-metal dielectric layer 440. A silicide layer 432 couples the contacts 430 to the source 404 and the drain 406. The TDN transistor 400 is further coupled to a handle wafer 460 through back-end-of-line (BEOL) layers 450. BEOL metals, however, are not placed over the channel 408.

Disadvantages of the TDN transistor 400 include field effects from the handle wafer 460, which is due to the handle wafer 460 being too far away and shielded by the gate 402. Additionally, conventional diffusion and polysilicon resistors are prone to severe bias interference from adjacent conductive layers and also exhibit non-negligible voltage dependence from voltages applied across the terminals. Therefore, there is a desire for small-sized, large-valued resistors that overcome these deficiencies.

Aspects of the present disclosure address these issues by providing a resistor having a semiconductor layer with a source region, a drain region, and a channel region between the source region and the drain region. The channel region may have a same polarity as the source region and the drain region. The resistor may further include a first inter-metal dielectric (IMD) layer on the channel region, and a front-side gate shield on the first IMD layer. The front-side gate shield may overlap the channel region. For example, the front-side gate shield may at least partially overlap the source region and the drain region.

According to aspects of the present disclosure, thick oxide depletion mode N-channel metal-oxide-semiconductor (NMOS) (TDN) transistors may be configured as voltage-controlled resistors. For example, the TDN transistors may have source and drain regions that are doped the same. According to aspects of the present disclosure, the TDN transistors may be implemented as N-type MOS resistors.

FIGS. 5A-5G illustrate N-type metal-oxide-semiconductor (MOS) resistors, according to aspects of the present disclosure. The N-type MOS resistors described herein either include a floating poly-Si gate or omit the poly-Si gate, in contrast to the conventional TDN transistors described above.

Figure 5A:
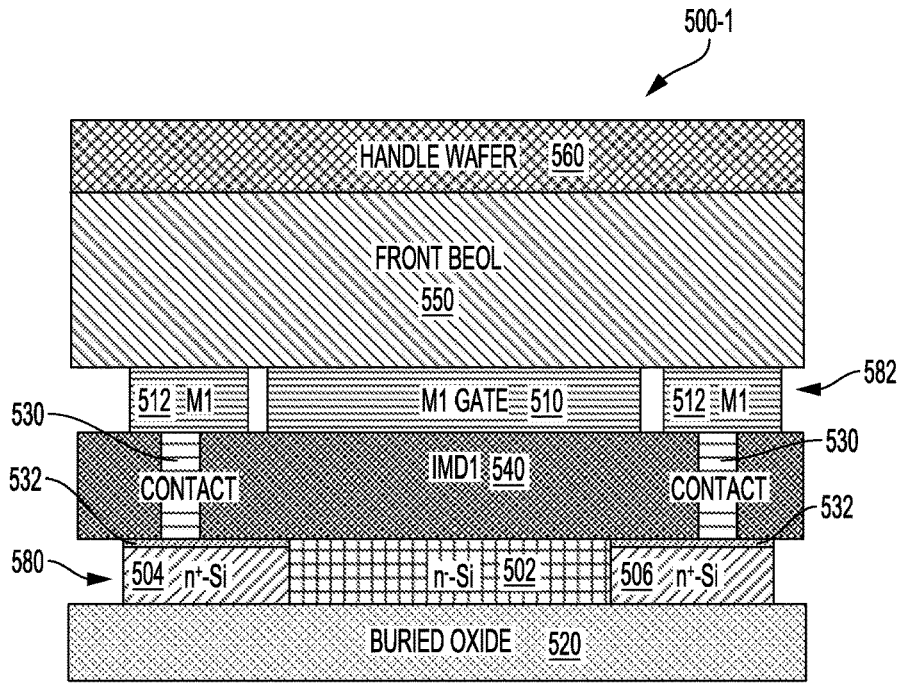
FIGS. 5A-5G illustrate N-type metal-oxide-semiconductor (MOS) resistors, according to aspects of the present disclosure.

FIG. 5A illustrates an N-type MOS resistor 500-1 having a front-side gate shield 510, according to aspects of the present disclosure. The MOS resistor 500-1 may include a semiconductor layer 580 having a source 504, a drain 506, and a channel 502. The source 504 and the drain 506 may be N+ doped silicon (Si) and the channel 502 may be N− doped Si. Of course, this doping is exemplary only, and the source 504, drain 506, and channel 502 may be alternatively doped in other configurations, as shown in FIG. 5G.

The channel 502 is between the source 504 and the drain 506. The semiconductor layer 580 may support a first inter-metal dielectric (IMD) layer 540. An M1 interconnect layer 582 (e.g., a first back-end-of-line (BEOL) interconnect (M1)) may be supported by the first IMD layer 540. For example, the M1 interconnect layer 582 may include M1 contacts 512 and the front-side gate shield 510.

Vias 530 may couple the source 504 and the drain 506 to the M1 contacts 512 (e.g., a first terminal and a second terminal). In one example, a silicide 532 couples the vias 530 to the source 504 and the drain 506. A buried oxide (BOX) layer 520 may support the semiconductor layer 580. A handle wafer 560 may be coupled to the M1 interconnect layer 582 through additional back-end-of-line (BEOL) layers 550.

According to an aspect of the present disclosure, the front-side gate shield 510 may laterally extend to substantially cover the channel 502. In this way, the front-side gate shield 510 may shield the MOS resistor 500-1 from bias interference coming from the BEOL layers 550 and above.

According to aspects of the present disclosure, a channel doping may be adjusted to achieve a nearly zero threshold voltage to make the MOS resistor 500-1 a depletion type or enhancement type transistor.

According to an additional aspect of the present disclosure, a third terminal may be coupled to the front-side gate shield 510. For example, the third terminal may tune a resistivity of the MOS resistor 500-1. The third terminal may also be coupled to a fixed voltage.

Advantages of the MOS resistor 500-1 include a small size and a large resistance value due to a low body conductance. The resistor also exhibits high linearity due to a very high threshold voltage. Manufacturing the resistor is simplified because a gate oxide and a polysilicon layer are removed from a TDN transistor fabrication process. The front-side gate shield contrasts with conventional devices that typically avoid placing BEOL interconnects over the channel region.

Figure 5B:
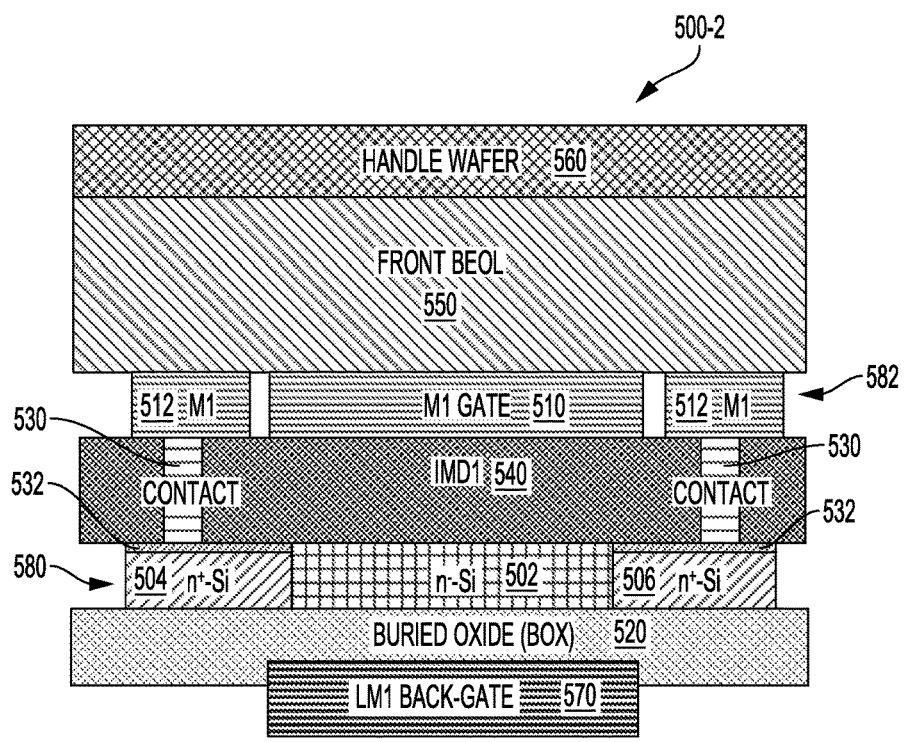

According to an aspect of the present disclosure of the present disclosure, as illustrated in FIG. 5B, an N-type MOS resistor 500-2 may further include a backside gate shield 570. For example, the backside gate shield 570 may be fabricated on a backside surface of the BOX layer 520. The backside gate shield 570 may laterally extend to substantially cover the channel 502 for shielding the MOS resistor 500-2 from bias interference coming from below the BOX layer 520. The MOS resistor 500-2 is otherwise substantially similar to the MOS resistor 500-1 of FIG. 5A.

According to additional aspects of the present disclosure, the backside gate shield 570 may be partially embedded in the BOX layer 520. For example, the backside gate shield 570 may be formed beneath the active layer by thinning the BOX layer 520 and depositing a post layer-transfer metal (e.g., lower metal 1 (LM1)). According to an aspect of the present disclosure, the backside gate shield 570 may be implemented in an SOI process as a well region with a doping opposite to that of the carrier wafer.

According to an aspect of the present disclosure, the BOX layer 520 may be thinned for substantially increasing control of the backside gate shield 570 by increasing an electrical field strength in an SOI CMOS process. For example, placing the backside gate shield 570 closer to the semiconductor layer 580 than the front-side gate shield 510 may provide more control and better conductance regulation. Additionally, the overlap of the backside gate shield 570 may be significant enough to shield the channel 502 from conductive layers beneath the MOS resistor 500-2. In some configurations, the backside gate primarily provides control whereas the front-side gate primarily provides shielding.

According to an aspect of the present disclosure, the backside gate shield 570 and the front-side gate shield 510 are coupled together to further improve shielding and enhance conductance control. For example, the front-side gate shield 510 may have a dual function of controlling a resistance of the MOS resistor 500-2, while also providing electrical shielding from the BEOL layers 550. This results in increased gate control.

Figure 5C:
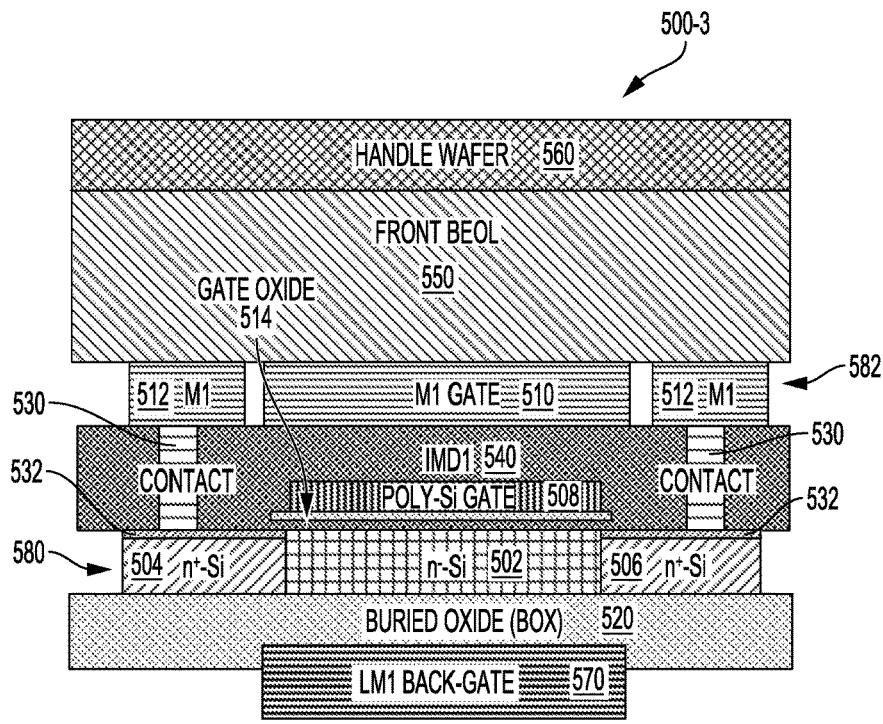

According to an additional aspect of the present disclosure, as illustrated in FIG. 5C, an N-type MOS resistor 500-3 may further include a polysilicon gate 508 (e.g., a floating polysilicon gate). The polysilicon gate 508 may provide accurate channel length definition via self-alignment during a process flow. The polysilicon gate 508 may be left floating, or may be connected to at least one of the source 504 or the drain 506. For example, the polysilicon gate 508 may be coupled to the channel 502 through a gate oxide layer 514. The BOX layer 520 may have a first surface adjacent to the semiconductor layer 580 and a second surface opposite the first surface that is coupled to the backside gate shield 570. The MOS resistor 500-3 is otherwise substantially similar to the MOS resistor 500-2 of FIG. 5B.

According to an aspect of the present disclosure, the front-side gate shield 510 may laterally extend to substantially cover the polysilicon gate 508 and the channel 502. The polysilicon gate 508 may be the same width as the channel 502, or narrower than the channel 502. The gate oxide layer 514 may be substantially the same width as the channel 502. For example, the polysilicon gate 508 may be self-aligned with the channel 502.

Advantages of the polysilicon gate 508 include a better channel length definition, while also allowing for a shorter channel length. Additionally, no special mask is used for the threshold voltage adjustment. There is also improvement in the quality of gate oxide-to-silicon interface, which improves low-frequency flicker noise.

Figure 5D:
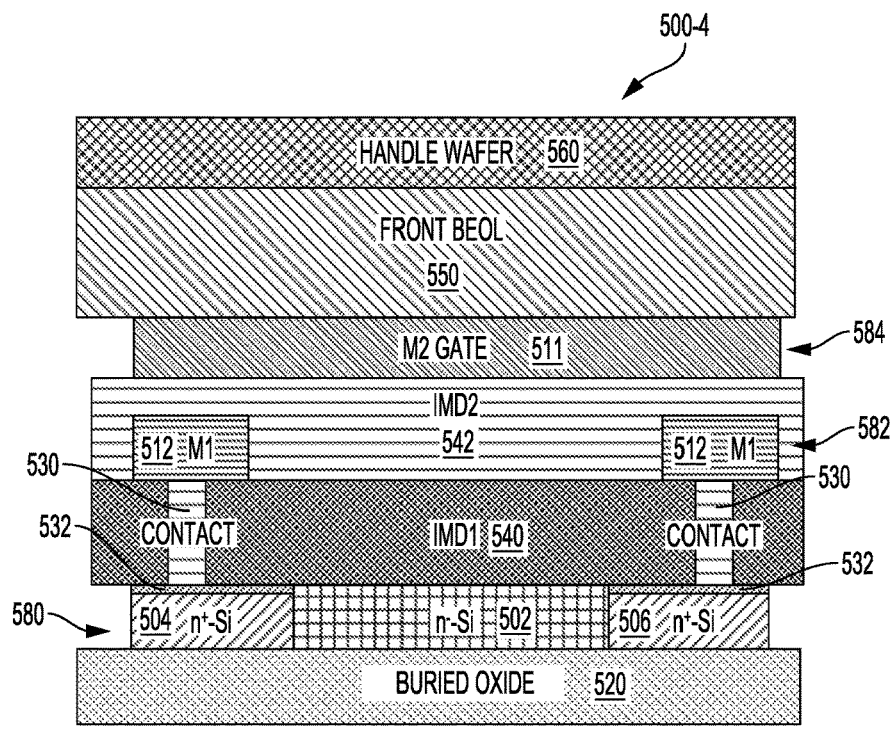

FIG. 5D illustrates an N-type MOS resistor 500-4 having an M2 layer front-side gate shield 511 formed in an M2 interconnect 584 layer (e.g., a second back-end-of-line (BEOL) interconnect (M2)) instead of the M1 interconnect layer 582, according to aspects of the present disclosure. For example, in place of a gate shield on the M1 interconnect layer, a second IMD layer 542 may be supported by the first IMD layer 540. For example, a first interconnect metal M1 may be replaced with a conductive layer. The M2 layer front-side gate shield 511 may then be formed over the second IMD layer 542. According to an aspect of the present disclosure, the M2 layer front-side gate shield 511 may extend laterally to substantially cover the source 504, the channel 502, and the drain 506. The MOS resistor 500-4 is otherwise substantially similar to the MOS resistor 500-1 of FIG. 5A.

Advantages include higher linearity compared to devices with an M1 level gate shield due to a reduced field strength. Additionally, the M2 layer front-side gate shield 511 provides more complete shielding because it covers all the contacts and M1 terminals of the MOS resistor 500-4.

Figure 5E:
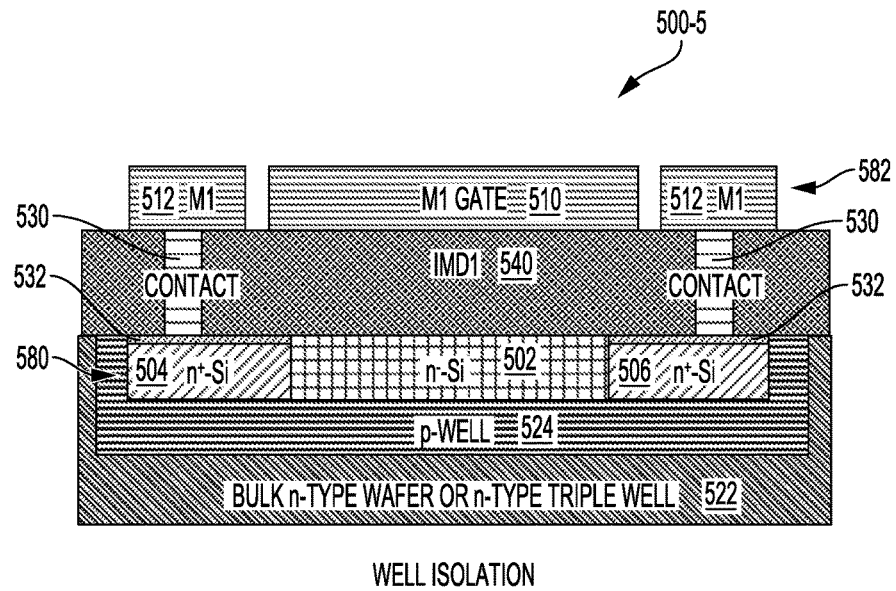

Aspects of the present disclosure are applicable to bulk semiconductor processing, in addition to SOI processing. FIG. 5E illustrates an N-type MOS resistor 500-5 having a front-side gate shield 510 with a well 524 supporting the semiconductor layer 580, according to aspects of the present disclosure. For example, the well 524 may at least partially surround the semiconductor layer 580. According to an aspect of the present disclosure, the well 524 is a P-well. Of course, the doping of the well 524 is exemplary only, and other alternative doping is possible. The well 524 may provide isolation through doping opposite from the semiconductor layer 580, as well as control. For example, a P-well may be used for control. Isolation may also be obtained from trenches.

An isolation region 522 may at least partially surround the well 524. For example, the isolation region 522 may be a bulk N-type wafer or an N-type triple well configured for providing well isolation. Alternatively, the isolation region 522 may be a bulk P-type wafer or a P-type triple well. The MOS resistor 500-5 is otherwise substantially similar to the MOS resistor 500-1 of FIG. 5A.

Figure 5F:
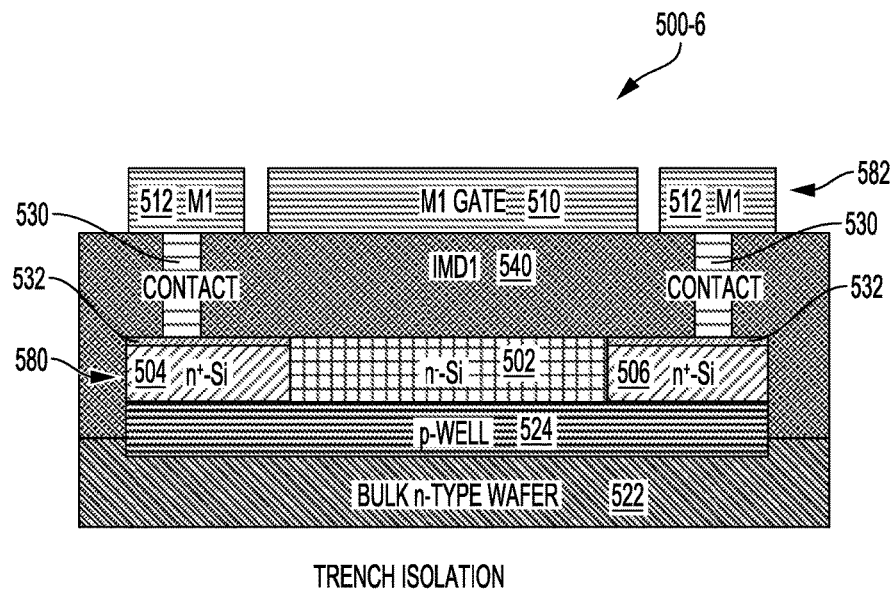
Figure 5G:
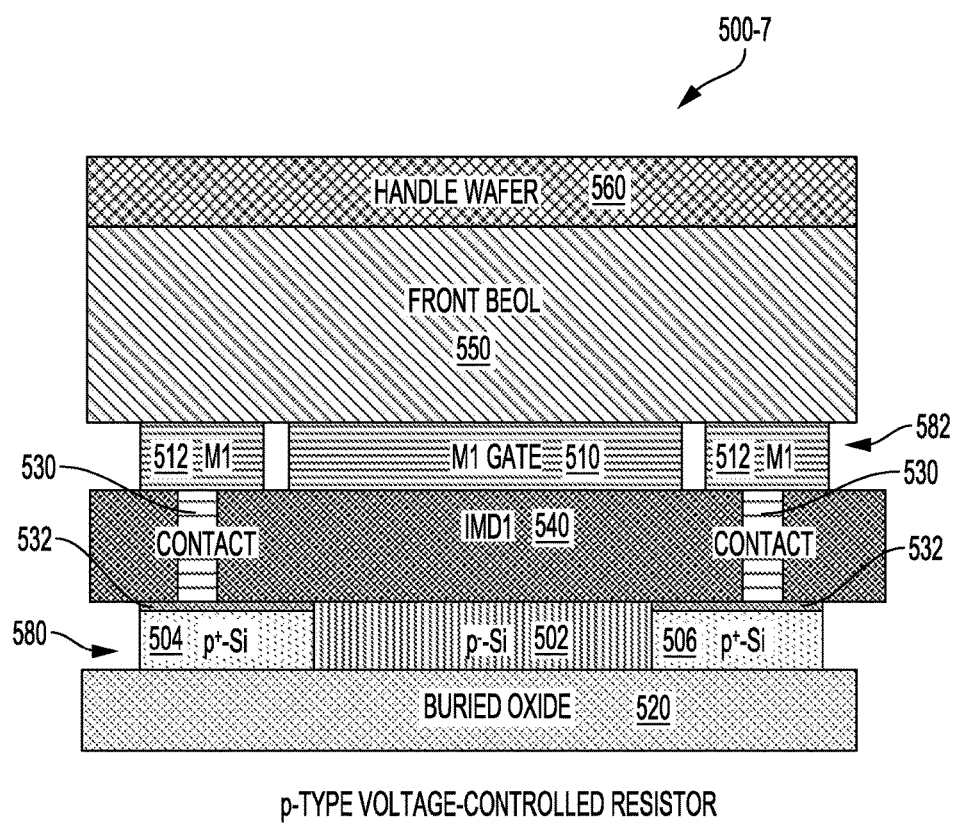

According to an additional aspect of the present disclosure, the well 524 may support the semiconductor layer 580 without surrounding the semiconductor layer 580, as illustrated by an N-type MOS resistor 500-6 in FIG. 5F. The isolation region 522 may also support the well 524 without surrounding the well 524 for providing trench isolation. The well 524 and the isolation region 522 may be P-doped or N-doped, according to aspects of the present disclosure.

According to aspects of the present disclosure, the backside gate shield 570 may include the well 524 (e.g., a diffusion region). For example, the diffusion region may be inside the semiconductor layer 580. The diffusion region may have a polarity inverse to a polarity of the semiconductor layer 580.

An advantage is that fabrication of the well 524 and the isolation region 522 may be produced through a standard bulk CMOS process. For example, front-gate control may be added along with appropriate adjustment of the doping in the active device channel of the MOS resistor 500-6.

FIG. 5G illustrates an N-type MOS resistor 500-7 having a front-side gate shield 510 with an alternative doping of the semiconductor layer 580, according to aspects of the present disclosure. For example, the MOS resistor 500-7 may be substantially similar to the MOS resistor 500-1 of FIG. 5A, except the semiconductor layer 580 is P− doped. In this example, the source 504 and the drain 506 may be P+ doped Si, and the channel 502 may be P− doped Si.

An advantage of having a P-type doping is that it is easier to achieve higher intrinsic resistance in the active channel region due to a lower hole mobility. Another advantage is higher linearity.

Figure 6:
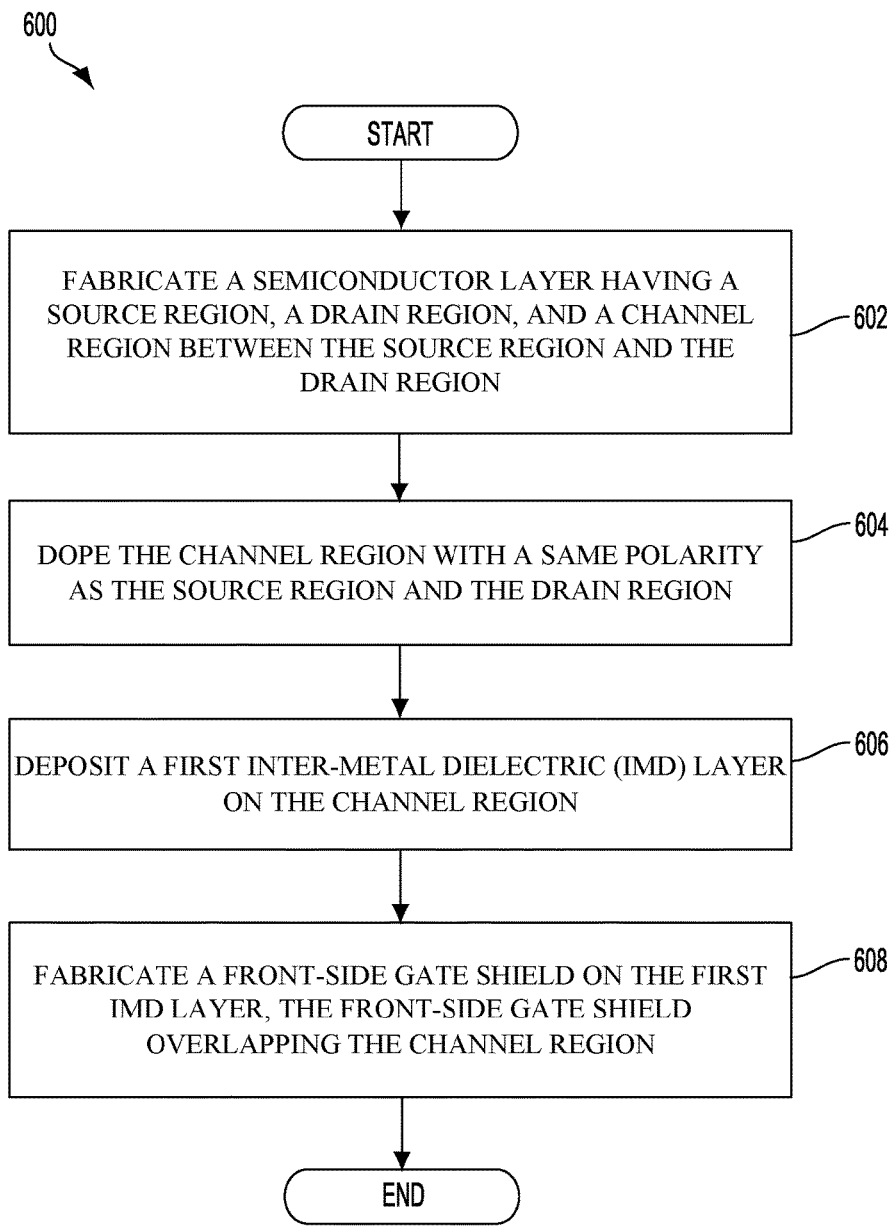
FIG. 6 illustrates a method for fabricating an N-type metal-oxide-semiconductor (MOS) resistor according to aspects of the present disclosure.

FIG. 6 illustrates a method of fabricating a resistor (e.g., N-type MOS resistor) according to aspects of the present disclosure. The method 600 begins at block 602, in which a semiconductor layer is fabricated. For example, as shown in FIG. 5A, the semiconductor layer may include a source region (e.g., 504), a drain region (e.g., 506), and a channel region (e.g., 502). The channel region may be created between the source region and the drain region.

At block 604, the channel region is doped with a same polarity as the source region and the drain region. For example, as shown in FIG. 5A, the source 504 and the drain 506 may be N+ doped silicon (Si) and the channel 502 may be N− doped Si. Of course, this doping is exemplary only, and the source 504, drain 506, and channel 502 may be alternatively doped, as described in FIG. 5G.

At block 606, a first inter-metal dielectric (IMD) layer is deposited on the channel region. For example, as shown in FIG. 5A, the first IMD layer 540 may be on the semiconductor layer 580.

At block 608, a front-side gate shield is fabricated on the first IMD layer, the front-side gate shield overlapping the channel region. For example, as shown in FIG. 5A, the front-side gate shield 510 may be fabricated in an M1 interconnect layer 582. Alternatively, as shown in FIG. 5D, the front-side gate shield 511 may be fabricated in an M2 interconnect layer 584.

According to an aspect of the present disclosure, an N-type MOS resistor is described. In one configuration, the MOS resistor includes means for shielding. For example, the shielding means may be the front-side gate shield 510, 511 of FIGS. 5A-5G. In one configuration, the MOS resistor includes backside shielding means. For example, the backside shielding means may be the backside gate shield 570 of FIGS. 5B and 5C. In another aspect, the aforementioned means may be any module or any apparatus or material configured to perform the functions recited by the aforementioned means.

Figure 7:
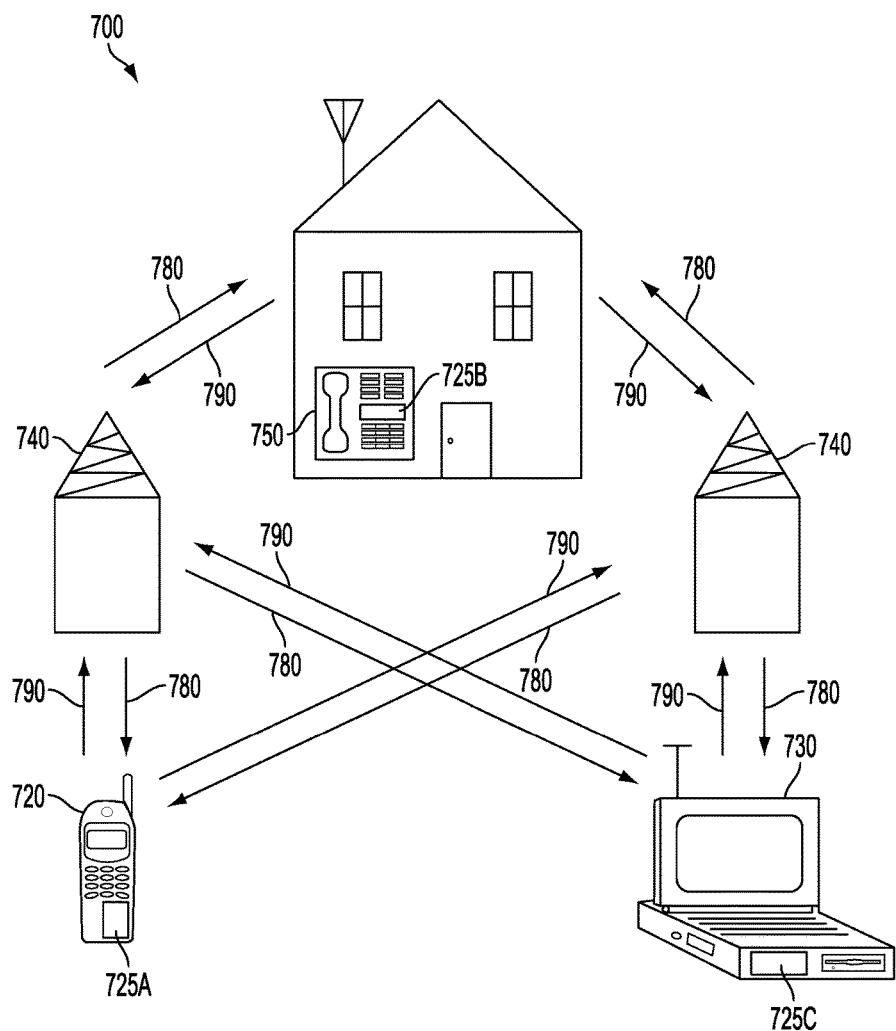
FIG. 7 is a block diagram showing an exemplary wireless communication system in which an aspect of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725B, and 725C that include the disclosed MOS resistor. It will be recognized that other devices may also include the disclosed MOS resistor, such as the base stations, switching devices, and network equipment. FIG. 7 shows forward link signals 780 from the base station 740 to the remote units 720, 730, and 750 and reverse link signals 790 from the remote units 720, 730, and 750 to base station 740.

In FIG. 7, remote unit 720 is shown as a mobile telephone, remote unit 730 is shown as a portable computer, and remote unit 750 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed MOS resistor.

Figure 8:
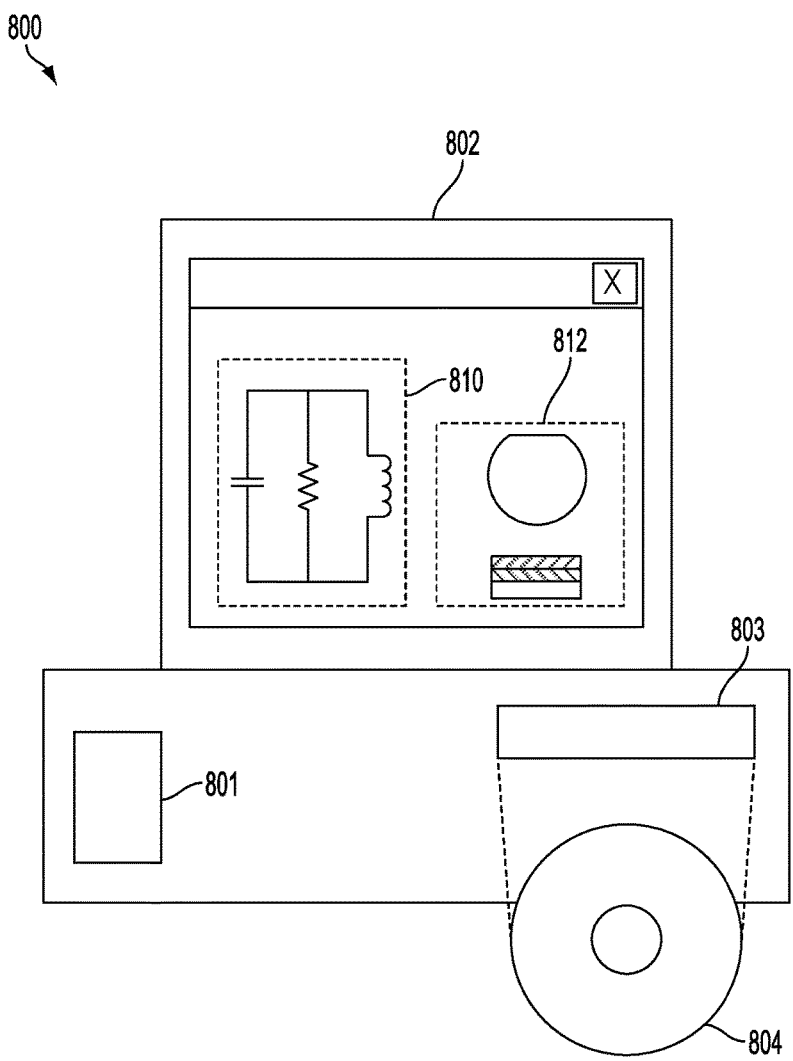
FIG. 8 is a block diagram illustrating a design workstation used for circuit, layout, and logic design of N-type metal-oxide-semiconductor (MOS) resistors according to one configuration.

FIG. 8 is a block diagram illustrating a design workstation used for circuit, layout, and logic design of an IC structure, such as the MOS resistor disclosed above. A design workstation 800 includes a hard disk 801 containing operating system software, support files, and design software such as Cadence or OrCAD. The design workstation 800 also includes a display 802 to facilitate design of a circuit 810 or an IC device 812 including the disclosed MOS resistor. A storage medium 804 is provided for tangibly storing the design of the circuit 810 or the IC device 812. The design of the circuit 810 or the IC device 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit 810 or the IC device 812 including the disclosed MOS resistor by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on non-transitory computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A resistor, comprising:
    a semiconductor layer having a source region, a drain region, and a channel region between the source region and the drain region, the channel region having a same polarity as the source region and the drain region;
    a first inter-metal dielectric (IMD) layer on the channel region; and
    a front-side gate shield on the first IMD layer and overlapping the channel region.

2. The resistor of claim 1, in which the front-side gate shield is arranged to at least partially overlap the source region and the drain region.

3. The resistor of claim 1, in which the front-side gate shield comprises a first back-end-of-line (BEOL) interconnect.

4. The resistor of claim 1, further comprising:
    a second IMD layer on the first IMD layer, in which the front-side gate shield comprises a second back-end-of-line (BEOL) interconnect on the second IMD layer and overlapping the channel region, the source region, and the drain region.

5. The resistor of claim 1, further comprising a backside gate shield.

6. The resistor of claim 5, in which the backside gate shield comprises a diffusion region supporting the semiconductor layer and the diffusion region is inside the semiconductor layer, the diffusion region having a polarity inverse to a polarity of the semiconductor layer.

7. The resistor of claim 1, further comprising a terminal coupled to the front-side gate shield and a backside gate shield.

8. The resistor of claim 1, further comprising a terminal coupled to the front-side gate shield and a fixed voltage.

9. The resistor of claim 1, integrated into a mobile phone, a set top box, a music player, a video player, an entertainment unit, a navigation device, a computer, a hand-held personal communication systems (PCS) unit, a portable data unit, and/or a fixed location data unit.

10. A method of fabricating a resistor, comprising:
fabricating a semiconductor layer comprising a source region, a drain region, and a channel region between the source region and the drain region;
doping the channel region to have a same polarity as the source region and the drain region;
depositing a first inter-metal dielectric (IMD) layer on the channel region; and
fabricating a front-side gate shield on the first IMD layer, the front-side gate shield overlapping the channel region.

11. The method of claim 10, further comprising:
depositing a second IMD layer on the first IMD layer, in which the front-side gate shield comprises a second back-end-of-line (BEOL) interconnect on the second IMD layer and overlapping the channel region, the source region, and the drain region.

12. The method of claim 10, further comprising fabricating a backside gate shield on a backside of the semiconductor layer.

13. The method of claim 10, in which the resistor is integrated into a mobile phone, a set top box, a music player, a video player, an entertainment unit, a navigation device, a computer, a hand-held personal communication systems (PCS) unit, a portable data unit, and/or a fixed location data unit.

14. A resistor, comprising:
a semiconductor layer having a source region, a drain region, and a channel region between the source region and the drain region, the channel region having a same polarity as the source region and the drain region;
a first inter-metal dielectric (IMD) layer on the channel region; and
means for shielding on the first IMD layer and overlapping the channel region.

15. The resistor of claim 14, in which the shielding means at least partially overlaps the source region and the drain region.

16. The resistor of claim 14, in which the shielding means comprises a first back-end-of-line (BEOL) interconnect.

17. The resistor of claim 14, further comprising:
a second IMD layer on the first IMD layer, in which the shielding means comprises a second back-end-of-line (BEOL) interconnect on the second IMD layer and overlapping the channel region, the source region, and the drain region.

18. The resistor of claim 14, further comprising a backside shielding means.

19. The resistor of claim 18, in which the backside shielding means comprises a diffusion region supporting the semiconductor layer and the diffusion region is inside the semiconductor layer, the diffusion region having a polarity inverse to a polarity of the semiconductor layer.

20. The resistor of claim 14, integrated into a mobile phone, a set top box, a music player, a video player, an entertainment unit, a navigation device, a computer, a hand-held personal communication systems (PCS) unit, a portable data unit, and/or a fixed location data unit.

* * * * *